US009711551B2

(12) United States Patent
Silsby

(10) Patent No.: US 9,711,551 B2
(45) Date of Patent: Jul. 18, 2017

(54) IMAGE SENSORS WITH COLOR FILTER WINDOWS

(71) Applicant: SEMICONDUCTOR COMPONENTS INDUSTRIES, LLC, Phoenix, AZ (US)

(72) Inventor: Christopher Silsby, Albany, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/150,997

(22) Filed: May 10, 2016

(65) Prior Publication Data
US 2017/0133420 A1    May 11, 2017

Related U.S. Application Data

(60) Provisional application No. 62/252,789, filed on Nov. 9, 2015.

(51) Int. Cl.
*H01L 31/0203*    (2014.01)
*H01L 27/146*    (2006.01)

(52) U.S. Cl.
CPC .. *H01L 27/14621* (2013.01); *H01L 27/14627* (2013.01)

(58) Field of Classification Search
CPC ......... H01L 27/14621; H01L 27/14627; H01L 257/432; H01L 31/0216; H01L 31/0232; H01L 31/054; H01L 25/00; H01L 25/167; H01L 27/14643; H01L 27/14645; H01L 27/14647; H01L 27/3227; H01L 31/0203; G02B 6/12019
See application file for complete search history.

(56) References Cited

U.S. PATENT DOCUMENTS

2013/0075607 A1*    3/2013    Bikumandla ..... H01L 27/14632
250/332

OTHER PUBLICATIONS

Hong, U.S. Appl. No. 14/877,722, filed Oct. 7, 2015.
Velichko et al., U.S. Appl. No. 14/836,599, filed Aug. 26, 2015.

* cited by examiner

*Primary Examiner* — Julio J Maldonado
*Assistant Examiner* — Stanetta Isaac
(74) *Attorney, Agent, or Firm* — Treyz Law Group, P.C.; Joseph F. Guihan

(57) ABSTRACT

An imaging pixel may include an upper substrate layer with a photosensitive layer and a lower substrate with a photosensitive layer. A color filter layer may be formed over the upper substrate layer. The color filter layer may include a color filter window that allows light to pass through the upper substrate layer to the photosensitive layer in the lower substrate. The color filter window may be formed from a dielectric material or from a color filter element with a different color than the surrounding color filter element. A metal interconnect layer may couple the lower substrate layer to the upper substrate layer. The color filter window may be formed in the central portion of a pixel, or between multiple pixels in an image sensor.

22 Claims, 11 Drawing Sheets

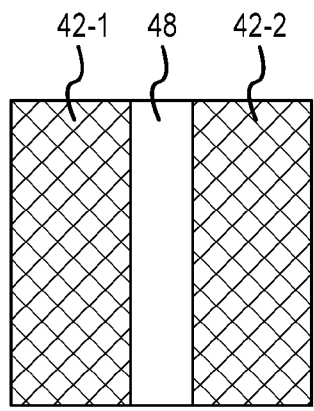
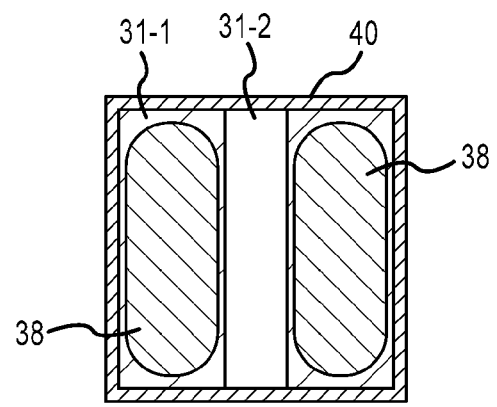
FIG.5A  FIG.5B
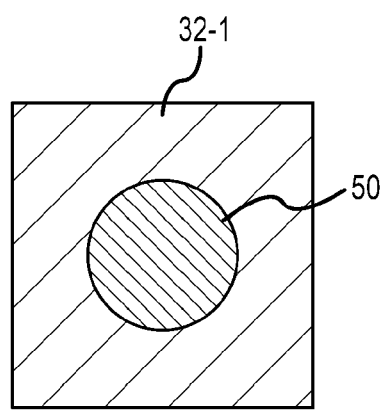
FIG.5C

IMAGE SENSORS WITH COLOR FILTER WINDOWS

CROSS-REFERENCE TO RELATED APPLICATIONS

This application claims priority to U.S. Provisional Application No. 62/252,789, filed on Nov. 9, 2015, entitled "Image Sensors with Color Filter Windows," invented by Christopher Silsby, and is incorporated herein by reference and priority thereto for common subject matter is hereby claimed.

BACKGROUND

This relates generally to imaging systems and, more particularly, to imaging systems with color filter arrays.

Modern electronic devices such as cellular telephones, cameras, and computers often use digital image sensors. Imager sensors (sometimes referred to as imagers) may be formed from a two-dimensional array of image sensing pixels. Each pixel includes a photosensitive layer that receives incident photons (light) and converts the photons into electrical signals. Image sensors are sometimes designed to provide images to electronic devices using a Joint Photographic Experts Group (JPEG) format.

Some conventional pixels may not have a high dynamic range, which is a measure of the range of light that can be accurately detected by an image sensor. Additionally, some conventional pixels may have low sensitivity to light with long wavelengths.

It would therefore be desirable to be able to provide improved pixels for image sensors.

BRIEF DESCRIPTION OF THE DRAWINGS

FIG. 5A is a cross-sectional top view of a pixel with a split photosensitive layer taken along line 54 of FIG. 2 in accordance with an embodiment of the present invention.

FIG. 5B is a cross-sectional top view of a pixel with a split photosensitive layer taken along line 56 of FIG. 2 in accordance with an embodiment of the present invention.

FIG. 5C is a cross-sectional top view of a pixel with a split photosensitive layer taken along line 58 of FIG. 2 in accordance with an embodiment of the present invention.

DETAILED DESCRIPTION

Figure 1:
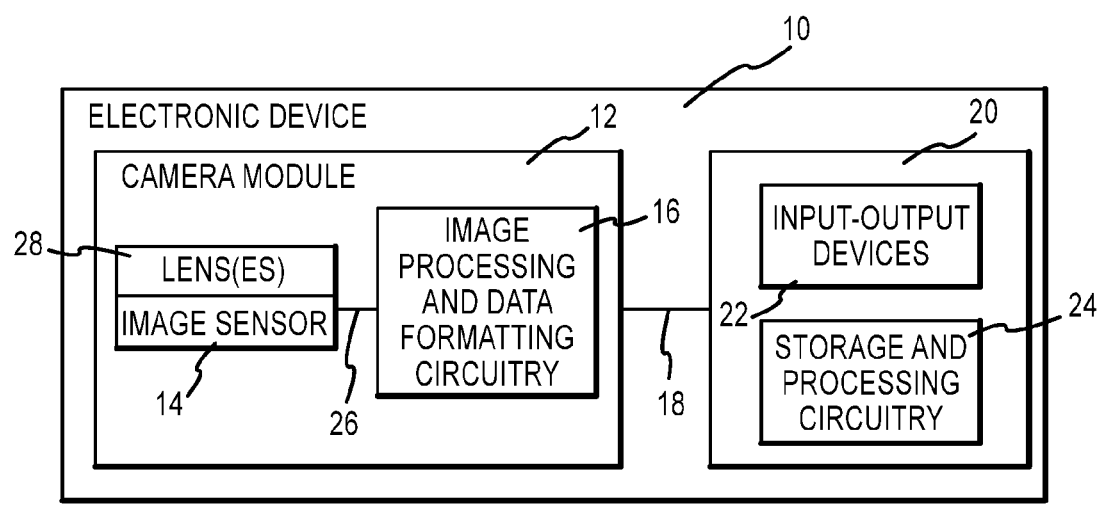
FIG. 1 is a schematic diagram of an illustrative electronic device with an image sensor in accordance with an embodiment of the present invention.

Embodiments of the present invention relate to image sensors with pixels that have color filter windows. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
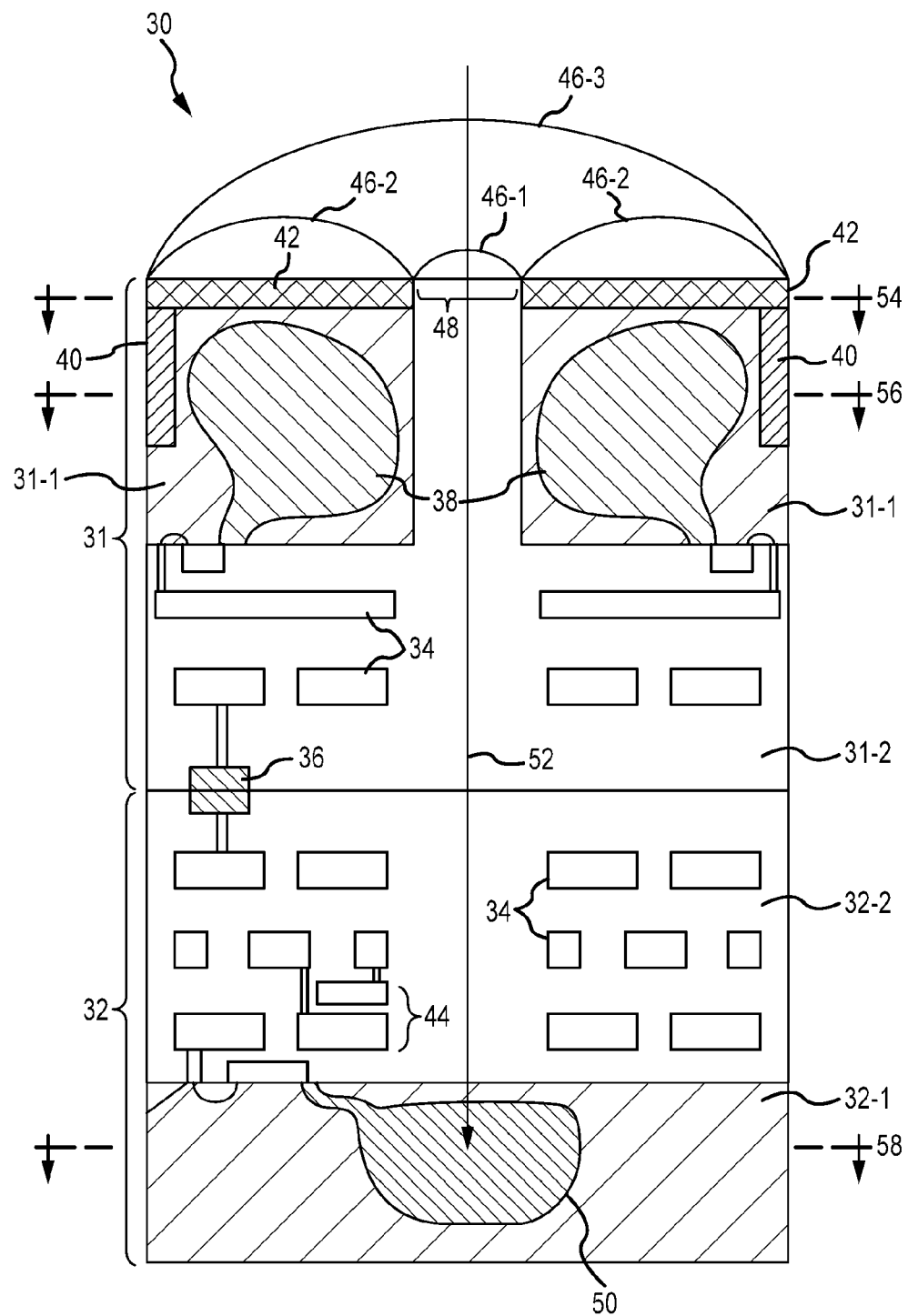
FIG. 2 is a cross-sectional side view of an illustrative pixel with a color filter window and an interconnect layer in accordance with an embodiment of the present invention.

FIG. 2 shows an illustrative pixel 30 of an image sensor such as image sensor 14 in FIG. 1. Pixel 30 may include two substrate layers. The substrate layers may be wafers, which include layers of semiconductor material such as silicon. An upper substrate layer 31 may be connected to a lower substrate layer 32. Upper and lower substrate layers 31 and 32 may include crystalline silicon or any other desired material. Upper and lower substrate layers 31 and 32 may also include a dielectric stack with metal interconnect routing paths. For example, upper substrate 31 may include silicon layer 31-1, dielectric stack 31-2, and metal interconnect routing paths 34. Similarly, lower substrate 32 may include silicon layer 32-1, dielectric stack 32-2, and metal interconnect routing paths 34 (for simplicity of the drawing every metal interconnect routing path is not explicitly labeled). Metal interconnect routing paths 34 may be used to form pixel circuitry for pixel 30 (e.g., transfer transistors, reset transistors, source follower transistors, etc.). Metal interconnect routing paths 34 may also be used to form any of the pixel circuitry mentioned in connection with FIG. 1 (e.g., bias circuitry, sample and hold circuitry, correlated double sampling circuitry, amplifier circuitry, analog-to-digital converter circuitry, data output circuitry, buffer circuitry, address circuitry, etc.).

An interconnect layer may be used to connect upper substrate layer 31 to lower substrate layer 32. Interconnect layer 36 may be formed from a conductive material such as metal. In certain embodiments, the interconnect layer may include solder. The interconnect layer may also be a through silicon via (TSV). The interconnect layer may be used to connect any desired components within pixel 30.

Pixel 30 may sometimes include a transfer transistor that transfers charge to a floating diffusion region. The floating diffusion region may be coupled to a source follower transistor. The source follower transistor may be coupled to pixel readout circuitry. A reset transistor may also be coupled to the floating diffusion region or a photosensitive region within pixel 30. Interconnect layer 36 may be coupled between the source follower transistor and the pixel readout circuitry, between the floating diffusion region and the source follower transistor, or between the floating diffusion region and the transfer transistor. Additionally, the interconnect layer may be coupled between the reset transistor and the floating diffusion region or between the reset transistor and the photosensitive region. One or more interconnect layers may be used to couple circuitry in upper substrate 30 to lower substrate 32. In general, an interconnect layer may be used to connect any circuitry in pixel 30.

Pixel 30 may have include photosensitive layer 38 in silicon layer 31-1 of upper substrate layer 31. Photosensitive layer 38 may be a photodiode formed from n-type doped silicon. The photosensitive layer may be surrounded by isolation layer 40. Isolation layer 40 and silicon layer 31-1 may be formed from p-type doped silicon. In certain embodiments, the photodiode may be formed from p-type doped silicon and the isolation layer and silicon layer 31-1 may be formed from n-type doped silicon. In yet another embodiment, isolation layer 40 may be formed using deep trench isolation (DTI) or a combination of deep trench isolation and doped silicon. Isolation layer 40 may prevent charge from leaking to adjacent photosensitive layers.

Pixel 30 may include color filter layer 42 and one or more of microlenses 46-1, 46-2, and 46-3. Pixel 30 may also include a passivation layer and planarization layer (not shown for simplicity) that are formed from dielectric or organic materials. The passivation layer and planarization layer may be formed adjacent to color filter layer 42. Color filter layer 42 may be a part of a larger color filter array. For example, each pixel in image sensor 14 may have an individual color filter layer that is part of the color filter array. Image sensor 14 may include a Bayer color filter array in which vertically and horizontally adjacent color filters in the array are of different colors. The Bayer color filter array includes red, green, and blue color filters. A single red, green, blue, cyan, magenta, yellow, near-infrared, infrared, or clear color filter may be formed over photosensitive layer 38. In certain embodiments, the color filter formed over photosensitive layer 38 may have areas that pass colored light and areas that are clear (i.e., that pass visible spectrum light).

In certain embodiments, pixel 30 may include an additional photosensitive layer such as photosensitive layer 50. Photosensitive layer may be formed in silicon layer 32-1 of lower substrate 32. Photosensitive layer 50 may be a photodiode formed from n-type doped silicon, while silicon layer 32-1 may be formed from p-type doped silicon. In certain embodiments, the photodiode may be formed from p-type doped silicon and silicon layer 32-1 may be formed from n-type doped silicon. Although not shown in FIG. 2, photosensitive layer 50 may optionally be surrounded by an isolation layer such as isolation layer 40.

Photosensitive layer 38 may be positioned in a first plane (e.g., a plane parallel to color filter layer 42). Photosensitive layer 50 may be positioned in a second plane that is parallel to and deeper than the first plane. Photosensitive layer 50 may be formed at a greater depth than photosensitive layer 38.

Color filter layer 42 may have a window such as window 48 (sometimes referred to as color filter window 48). Window 48 may be an opening in color filter layer 42 that allows light (e.g., light ray 52) to pass to photosensitive layer 50. Color filter window 48 may be formed by an opening in the surrounding color filter layer 42. The opening may be filled with dielectric material from dielectric stack 31-2. In other embodiments the window may include a color filter element. The window may include a color filter element that has a different color than the color of color filter layer 42. For example, color filter layer 42 may have a green color while window 48 may have a red color or a clear color. This example is purely illustrative. Window 48 may include a broadband color filter such as a near-infrared, infrared, or clear color filter.

Figure 3:
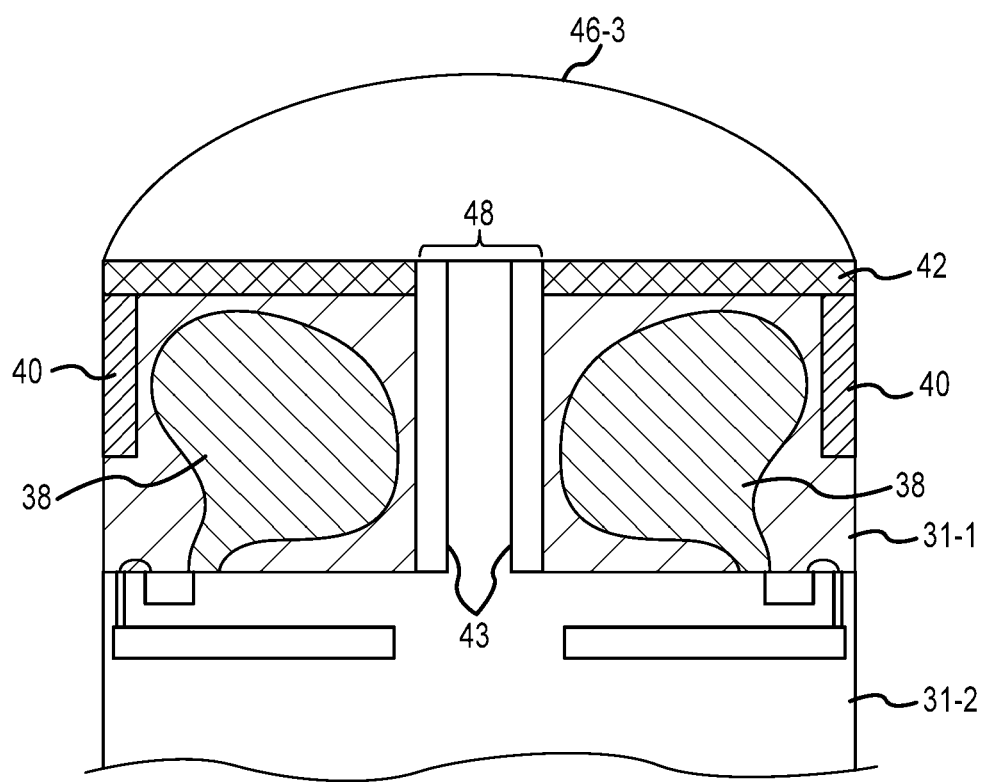
FIG. 3 is a cross-sectional side view of an illustrative pixel with a color filter window lined with an additional material in accordance with an embodiment of the present invention.

If desired, an anti-reflective coating or a color filter may also be included on the edge of silicon layer 31-1 (e.g., interposed between silicon layer 31-1 and dielectric layer 31-2). FIG. 3 shows an embodiment of this type where material 43 is formed on the edges of silicon layer 31-1. Material 43 may be a color filter or an anti-reflective coating. FIG. 3 shows color filter 43 positioned along the entire edge of silicon layer 31-1. However, this example is merely illustrative. If desired, color filter 43 may be positioned only adjacent to color filter layer 42. In general, color filter 43 may be positioned adjacent to some or all of color filter layer 42 and some or all of silicon layer 31-1. Similarly, an additional color filter element may fill window 48 and be positioned adjacent to some or all of material 43. Color filter 43 may have a color that matches the color of color filter layer 42, or color filter 43 may be a different color than color filter layer 42. FIG. 3 also illustrates an embodiment with a single microlens 46-3 covering photosensitive layer 38 and photosensitive layer 58.

The dielectric material 31-2 and 32-2 may act as a light guide that guides light to photosensitive layer 50. Only dielectric material may be interposed between window 48 and the top surface of silicon layer 32-1, as shown in FIG. 2.

One or more microlenses may be formed over each pixel in image sensor 14. Each microlens may direct light towards one or more photosensitive layers. FIG. 2 shows a first microlens 46-1 formed over photosensitive layer 50, a second microlens 46-2 formed over photosensitive layer 38, and a third microlens 46-3 formed over both photosensitive layers 38 and 50. Optionally, microlens 46-3 may be included without microlenses 46-1 and 46-2. Microlenses 46-1 and 46-3 may be circular shaped microlenses, while microlens 46-2 may be a toroidal microlens. Microlens 46-1 may overlap photosensitive layer 50 without overlapping photosensitive layer 38. Similarly, microlens 46-2 may overlap photosensitive layer 38 without overlapping photosensitive layer 50.

Operation of pixel 30 may be improved by photosensitive layer 50 and accompanying window 48. For example, the photosensitive layer 50 may be helpful in high dynamic range applications. Dynamic range is a measure of the range of light that can be accurately detected by an image sensor. To produce high dynamic range images, image sensors should optimally be sensitive to both low and high light conditions. Because photosensitive layer 50 is formed in lower substrate 32, photosensitive layer 50 may not saturate easily and may be sensitive to high light levels. To produce high dynamic range (HDR) images with pixel 30, the signal from photosensitive layers 38 and 50 may be read out separately and processed to form a HDR image.

Another advantage of the positioning of photosensitive layer 50 is that photosensitive layer 50 may be sensitive to longer wavelengths of light. Light with longer wavelengths typically penetrates deeper into image sensors before being converted to measurable charge. Therefore, photosensitive layer 50 may have heightened sensitivity to light with longer wavelengths (e.g., red light, infrared light, near-infrared light, etc.). In certain embodiments, the signal from photosensitive layers 38 and 50 may be read out from pixel 30 separately. However, in other embodiments, the signal from photosensitive layers 38 and 50 may be combined and read out as one cumulative signal.

In certain embodiments, only one wafer may be used instead of the stacked wafers shown in FIG. 2. In these embodiments, photosensitive layers 38 and 50 may both be formed in a single wafer. This arrangement may be advantageous in certain applications. However, in some circumstances it may be advantageous to have photosensitive layers 38 and 50 in separate wafers. By separating photosensitive layers 38 and 50 (e.g., FIG. 2), photosensitive layer 50 may be less susceptible to blooming cross-talk from photosensitive layer 38, allowing photosensitive layer 50 to be thicker and deeper and wafer element 32-1 to be thicker and more sensitive to longer wavelengths. Also, using stacked wafers may allow photosensitive layer 38 to have a greater size than if only one wafer was used.

If desired, pixel 30 may be provided with a transistor used to implement a dual conversion gain mode. Conversion gain may be defined as the change in voltage for each unit of charge accumulated by a photodiode. It may be desirable to be able to control the conversion gain of pixel 30. Pixel 30 may be operable in a high conversion gain mode and in a low conversion gain mode. If the dual conversion gain transistor is disabled, pixel 30 will be placed in a high conversion gain mode. If the dual conversion gain transistor is enabled, pixel 30 will be placed in a low conversion gain mode. The dual conversion gain transistor may be coupled to a capacitor (e.g., capacitive element 44 in FIG. 2). When the dual conversion gain transistor is turned on, the capacitor may be switched into use to provide additional capacitance to a charge storage region within the pixel (e.g., a floating diffusion region). This results in lower conversion gain for pixel 30. When the dual conversion gain transistor is turned off, the additional loading of the capacitor is removed and the pixel reverts to a relatively higher pixel conversion gain configuration.

There are many possible arrangements to allow window 48 to expose photosensitive layer 50 to light. In one embodiment, for example, window 48 may be an opening in color filter layer 42 that is completely surrounded by color filter layer 42. Similarly, photosensitive layer 38 may have a ring shape that allows light to pass through an opening the photosensitive layer. An arrangement of this type is shown in FIGS. 4A, 4B, and 4C.

Figure 4A:
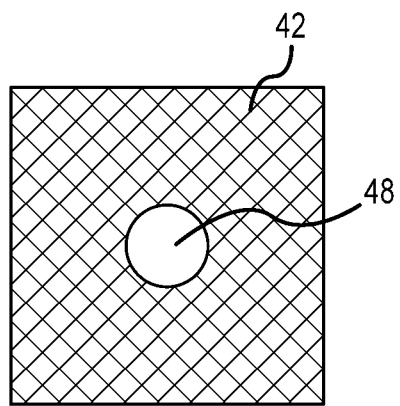
FIG. 4A is a cross-sectional top view of a pixel with a ring-shaped photosensitive layer taken along line 54 of FIG. 2 in accordance with an embodiment of the present invention.

FIG. 4A is a cross-sectional top view of pixel 30 taken along line 54 of FIG. 2. As shown in FIG. 4A, window 48 may be a circular opening in color filter layer 42. The example of window 48 having a circular shape is purely illustrative, and window 48 may be any desired shape (e.g., a square, a rectangle, an oval, etc.). Window 48 may be filled with dielectric material (e.g., dielectric 31-2), a color filter element, or any other desired material. In certain embodiments, color filter material that matches the color of color filter 42 may be positioned on the edges of silicon layer 31-1. Including color filter on the edges of layer 31-1 may improve the color cross-talk between photosensitive layer 50 and photosensitive layer 38.

Figure 4B:
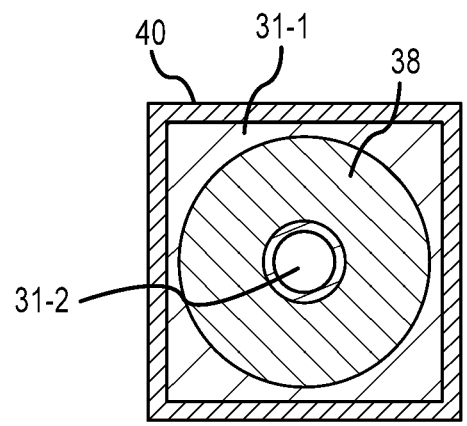
FIG. 4B is a cross-sectional top view of a pixel with a ring-shaped photosensitive layer taken along line 56 of FIG. 2 in accordance with an embodiment of the present invention.

FIG. 4B is a cross-sectional top view of pixel 30 taken along line 56 of FIG. 2. As shown in FIG. 4B, silicon layer 31-1 may have a photosensitive layer 38 surrounded by isolation layer 40. Photosensitive layer 38 may have a circular shape. However, this example is purely illustrative, and photosensitive layer 38 may be any desired shape (e.g., a square, a rectangle, an oval, etc.). Photosensitive layer 38 and silicon layer 31-1 may have an opening to allow light that passes through window 48 to pass through to photosensitive layer 50. The opening may be any desired shape (e.g., a circle, a square, a rectangle, an oval, etc.). Photosensitive layer 38 may sometimes be referred to as a ring-shaped photosensitive layer, and silicon layer 31-1 may also be described as ring-shaped. The opening may be filled with dielectric material (e.g., dielectric 31-2).

Figure 4C:
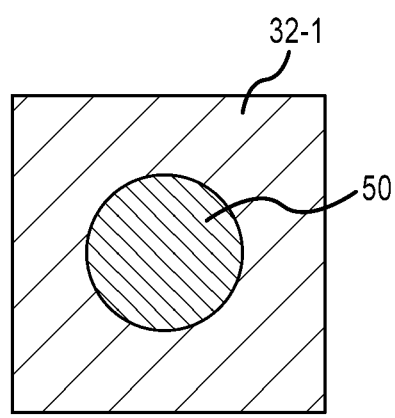
FIG. 4C is a cross-sectional top view of a pixel with a ring-shaped photosensitive layer taken along line 58 of FIG. 2 in accordance with an embodiment of the present invention.

FIG. 4C is a cross-sectional top view of pixel 30 taken along line 58 of FIG. 2. As shown, photosensitive layer 50 may be formed in silicon layer 32-1. Photosensitive layer 50 may be any desired shape (e.g., a circle, a square, a rectangle, an oval, etc.).

In other embodiments, window 48 may not be completely surrounded by color filter layer 42. For example, window 48 may split color filter layer 42 into one or more sections. An arrangement of this type is shown in FIGS. 5A, 5B, and 5C.

FIG. 5A is a cross-sectional top view of pixel 30 taken along line 54 of FIG. 2. As shown in FIG. 5A, window 48 may be a rectangular opening that splits color filter layer 42 into two halves (42-1 and 42-2). The example of window 48 having a rectangular shape is purely illustrative, and window 48 may be any desired shape. Window 48 may be filled with dielectric material (e.g., dielectric 31-2), a color filter element, or any other desired material.

FIG. 5B is a cross-sectional top view of pixel 30 taken along line 56 of FIG. 2. As shown in FIG. 5B, silicon layer 31-1 may have a photosensitive layer 38 surrounded by isolation layer 40. Silicon layer 31-1 and photosensitive layer 38 may be split into two halves by an opening that overlaps window 48. Photosensitive layer 38 may sometimes be referred to as a split photosensitive layer. The opening may be any desired shape (e.g., a circle, a square, a rectangle, an oval, etc.). The opening may be filled with dielectric material (e.g., dielectric 31-2).

FIG. 5C is a cross-sectional top view of pixel 30 taken along line 58 of FIG. 2. As shown, photosensitive layer 50 may be formed in silicon layer 32-1. Photosensitive layer 50 may be any desired shape (e.g., a circle, a square, a rectangle, an oval, etc.).

Figure 6A:
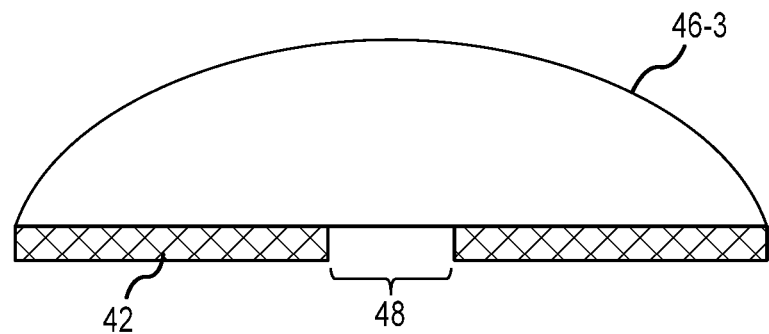
FIGS. 6A-6E are cross-sectional side views of illustrative microlens arrangements for a pixel with a color filter window in accordance with an embodiment of the present invention.
Figure 6B:
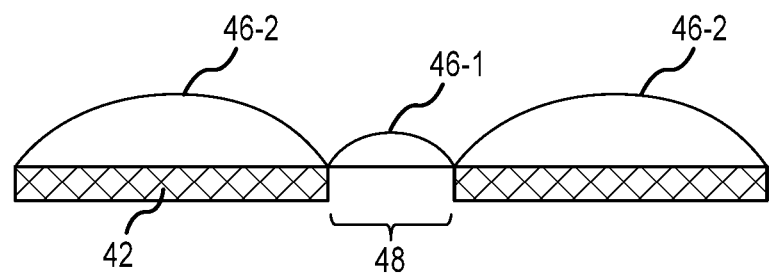
Figure 6C:
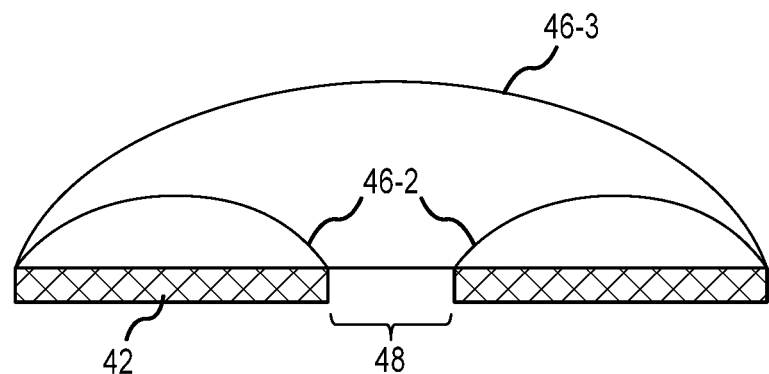
Figure 6D:
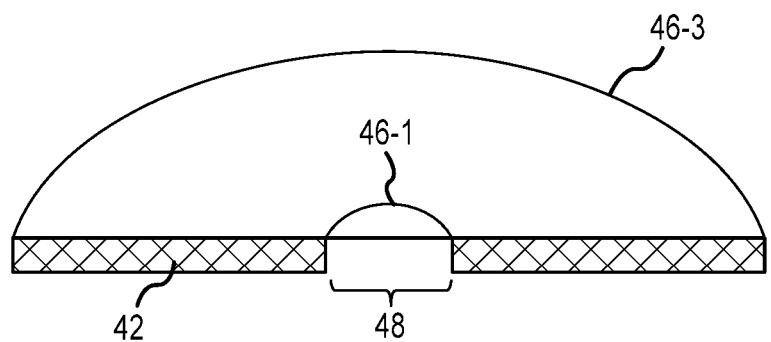
Figure 6E:
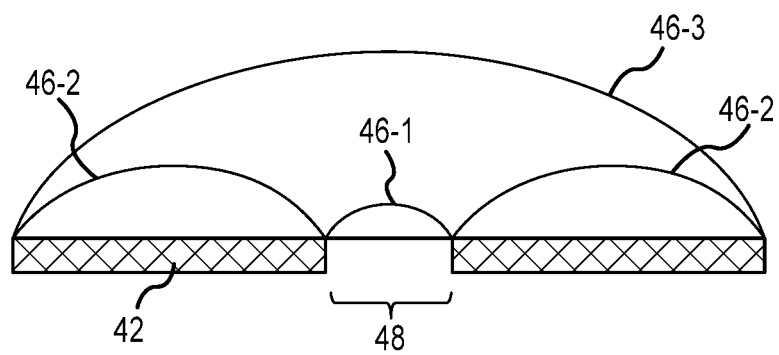

Photosensitive layers 38 and 50 of FIG. 2 may be covered by one or microlenses. Illustrative examples of microlens arrangements for pixel 30 in FIG. 2 are shown in FIGS. 6A-6E. As shown in FIG. 6A, a single microlens 46-3 may be used to cover both photosensitive layer 50 (below window 48) and photosensitive layer 38 (below color filter layer 42). As shown in FIG. 6B, microlens 46-1 may be used to cover photosensitive layer 50 while microlens 46-2 may be used to cover photosensitive layer 38. Microlens 46-2 may be a toroidal microlens with an opening such that microlens 46-1 is completely surrounded by microlens 46-2 (e.g., in embodiments such as those shown in FIGS. 4A-4C). In other embodiments, microlens 46-2 may include two microlenses, with each microlens covering a respective half of photosensitive layer 38 (e.g., in embodiments such as those shown in FIGS. 5A-5C). FIG. 6C shows that the microlens formed over only window 48 may be omitted. Microlens 46-2 may cover photosensitive layer 38. Additionally, microlens 46-3 may cover both photosensitive layers 38 and 50. FIG. 6D shows that the microlens formed over only color filter layer 42 may be omitted. Microlens 46-1 may cover photosensitive layer 50. Additionally, microlens 46-3 may cover both photosensitive layers 38 and 50. Microlens 46-3 may be used exclusively to cover photosensitive layers 38 and 50 as previously shown in FIG. 6A. FIG. 6E shows that microlens 46-1 may cover photosensitive layer 50, microlens 46-2 may cover photosensitive layer 38, and microlens 46-3 may cover both photosensitive layers 38 and 50. In general, any combination of microlenses may be used to focus light on photosensitive layers 38 and 50.

Figure 7:
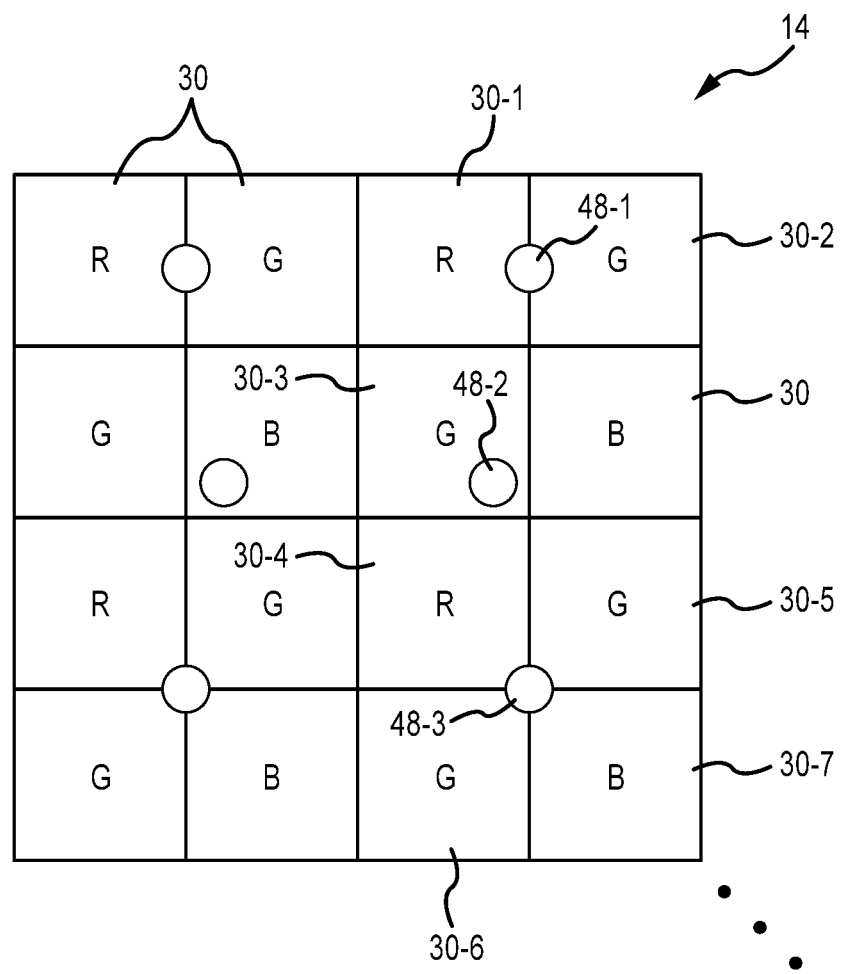
FIG. 7 is a top view of an illustrative image sensor with a color filter window in accordance with an embodiment of the present invention.

In the foregoing examples, embodiments were described where a color filter window is formed in a color filter layer in the central portion of an individual pixel. However, these examples are purely illustrative. As shown in FIG. 7, color filter windows may be formed at any desired location within an image sensor. For example, window 48-1 may be formed in between two pixels. In these embodiments, there may also be an opening between the silicon layers of pixel 30-1 and pixels 30-2 to allow light to pass through window 48-1 to an additional photosensitive layer. In other embodiments, windows such as window 48-2 may be formed in the periphery of a single pixel 30-3. This would remove the need to have an opening in the photosensitive layer of pixel 30-3. Additionally, a window such as window 48-3 may be positioned between four pixels. This may ensure minimal disruption to the structure of pixels 30-4, 30-5, 30-6, and 30-7. In general, a window may be provided at any location within image sensor 14 to allow light to reach photosensitive layers such as photosensitive layers 50. FIG. 7 shows an image sensor with a Bayer color filter array with red (R), green (G), and blue (B) color filter elements. However, this example is merely illustrative and any desired color filter array may be used.

Figure 8:
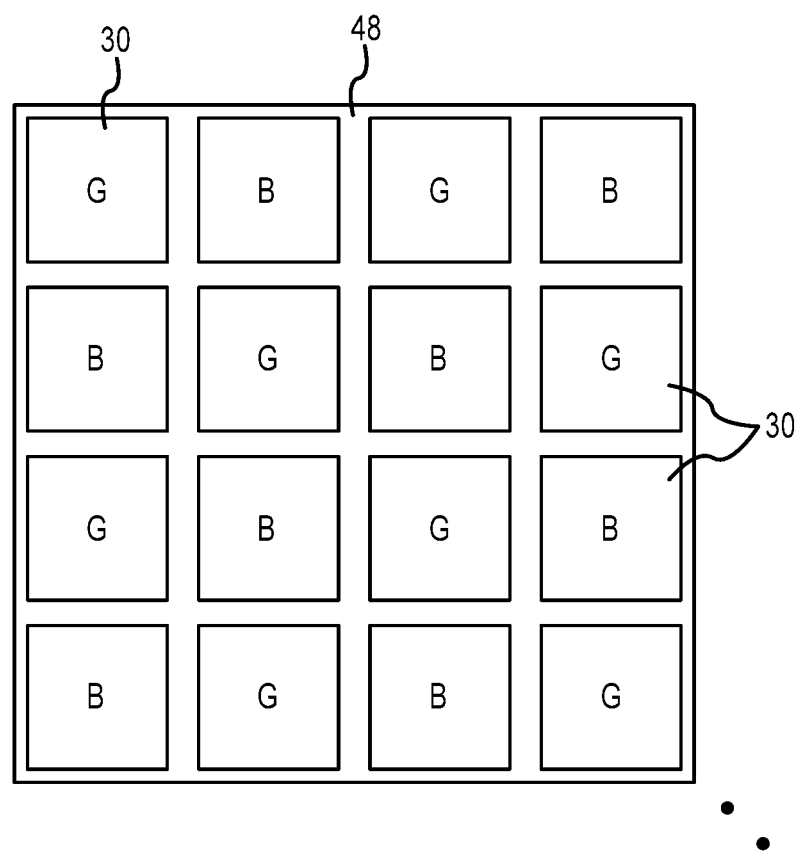
FIG. 8 is a top view of an illustrative image sensor with a color filter window positioned in between each pixel in an array in accordance with an embodiment of the present invention.

FIG. 8 shows an illustrative image sensor with a color filter array formed with blue (B) and green (G) color filter elements. In between each color filter element may be color filter window 48. Color filter window 48 may be a red color filter that allows a photosensitive layer in a lower substrate to collect red light. Color filter window 48 may also include material that lines the silicon layers of pixels 30 (as shown in FIG. 3). For example, a blue color filter may line the edges of window 48 adjacent to the silicon layers of pixels with blue color filter elements, while a green color filter may line the edges of window 48 adjacent to the silicon layers of pixels with green color filter elements. The example of a color filter window with red color filter material interposed between blue and green color filter elements is merely illustrative, and any combinations of colors may be used to form an image sensor.

Figure 9:
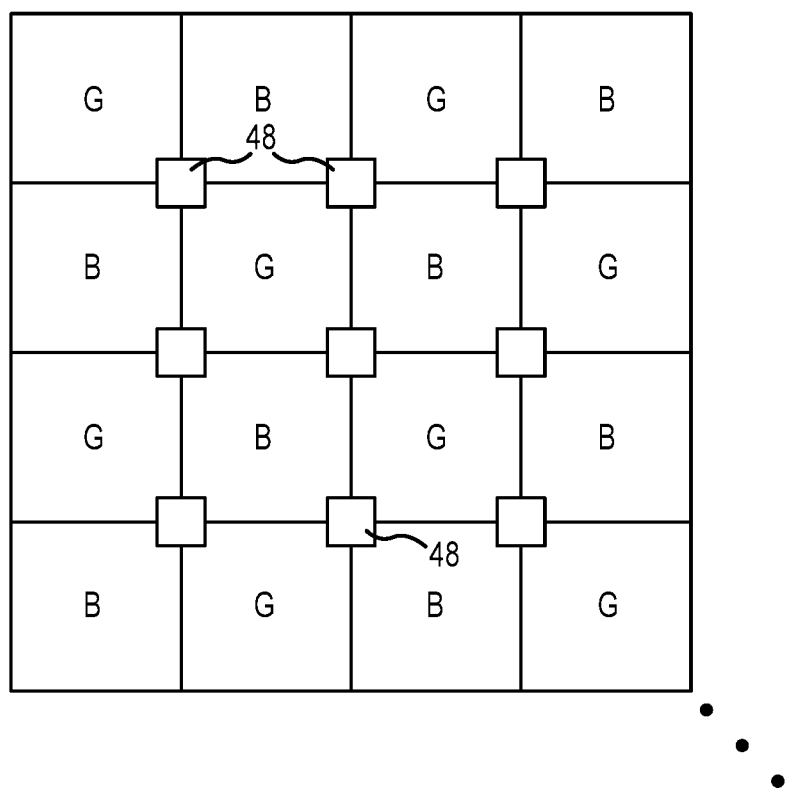
FIG. 9 is a top view of an illustrative image sensor with color filter windows positioned at the corners of blue and green pixels in accordance with an embodiment of the present invention.
Figure 10:
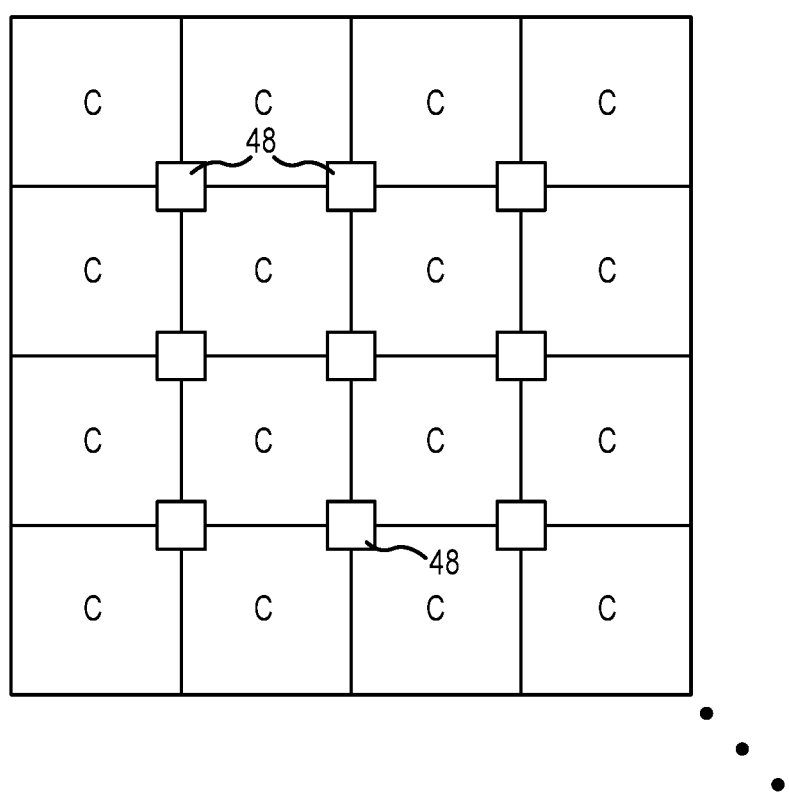
FIG. 10 is a top view of an illustrative image sensor with color filter windows positioned at the corners of clear pixels in accordance with an embodiment of the present invention.

In another embodiment, color filter windows may be formed at the corners of pixels in an array, as shown in FIG. 9. As shown, color filter windows 48 may be formed at the corner of each pixel in an array of pixels. The array may have blue (B) and green (G) color filter elements. Color filter windows 48 may include red color filter elements that allow a photosensitive layer in a lower substrate to collect red light. Color filter elements may fill window 48 to any desired depth. Color filter windows 48 may contain color filter elements of other colors or dielectric material if desired. Moreover, the example of color filter windows 48 in the corners of blue and green pixels is merely illustrative. As shown in FIG. 10, the color filter windows may be formed in the corners of clear pixels (C). In general, pixels of any color may contain color filter windows 48 in any desired location.

In various embodiments of the invention, an imaging pixel may include an upper substrate layer, a lower substrate layer, a first photodiode in the upper substrate layer, a second photodiode in the lower substrate layer, and a color filter layer formed over the upper substrate layer. The color filter layer may have an opening that allows light to pass through the upper substrate layer to the second photodiode. The opening in the color filter layer may be filled with dielectric material. The color filter layer may have a first color, the opening in the color filter layer may be filled with a color filter element that has a second color, and the first and second colors may be different. The color filter element may be a clear color filter element, or a combination of clear and non-clear color filters.

The upper substrate layer may include a silicon layer and a dielectric layer. The first photodiode may be formed in the silicon layer while metal interconnect routing paths may be formed in the dielectric layer. The opening in the color filter layer may be filled with the dielectric layer. The silicon layer may have an additional opening that overlaps the opening in the color filter layer. The lower substrate layer may include an additional silicon layer and an additional dielectric layer. The second photodiode may be formed in the additional silicon layer, while additional metal interconnect routing paths may be formed in the additional dielectric layer. The imaging pixel may also include an interconnect layer that couples the metal interconnect routing paths to the additional interconnect routing paths. The imaging pixel may also include a microlens formed over the opening in the color filter layer. The microlens may overlap the second photodiode. The imaging pixel may also include an additional microlens formed over the first photodiode.

In various embodiments, an imaging pixel may include a first wafer with a first photosensitive layer, a second wafer with a second photosensitive layer, and a color filter layer that overlaps the first photosensitive layer. The color filter layer may include a window that overlaps the second photosensitive layer without overlapping the first photosensitive layer. The window may include a dielectric material. The color filter layer may have a first color, the window may include a color filter element that has a second color, and the first and second colors may be different. The first and second wafers may be coupled together by a metal interconnect layer. The imaging pixel may also include a first microlens formed over the first photosensitive layer, a second microlens formed over the second photosensitive layer, and a third microlens formed over the first and second photosensitive layers. The second microlens may be completely surrounded by the first microlens.

In various embodiments, an image sensor may include a first plurality of photodiodes positioned in a first plane, a color filter array with a plurality of color filter elements, and a second photodiode positioned in a second plane that is different from the first plane. Each color filter element of the plurality of color filter elements may overlap a respective photodiode of the first plurality of photodiodes, and the color filter array may include a window that overlaps the second photodiode to allow light to reach the second photodiode. The first plurality of photodiodes may be positioned a first distance from the color filter array, the second photodiode may be positioned a second distance from the color filter array, and the second distance may be greater than the first distance. The window may be formed in a single color filter element of the plurality of color filter elements. Alternatively, the window may be formed between at least two color filter elements of the plurality of color filter elements.

The foregoing is merely illustrative of the principles of this invention and various modifications can be made by those skilled in the art without departing from the scope and spirit of the invention.

What is claimed is:

1. An imaging pixel comprising:
   an upper substrate layer;
   a lower substrate layer;
   a first photodiode in the upper substrate layer;
   a second photodiode in the lower substrate layer; and
   a color filter layer formed over the upper substrate layer, wherein the color filter layer has first and second opposing surfaces, wherein the color filter layer has an opening that extends from the first surface to the second surface, wherein the opening allows light to pass through the first photodiode to the second photodiode, and wherein the opening overlaps the second photodiode without overlapping the first photodiode.

2. The imaging pixel defined in claim 1, wherein the opening in the color filter layer is filled with dielectric material.

3. The imaging pixel defined in claim 1, wherein the color filter layer has a first color, wherein the opening in the color filter layer is filled with a color filter element that has a second color, and wherein the first and second colors are different.

4. The imaging pixel defined in claim 3, wherein the color filter element is a clear color filter element.

5. The imaging pixel defined in claim 1, wherein the upper substrate layer comprises a silicon layer and a dielectric layer, wherein the first photodiode is formed in the silicon layer, and wherein metal interconnect routing paths are formed in the dielectric layer.

6. The imaging pixel defined in claim 5, wherein the opening in the color filter layer is filled with the dielectric layer.

7. The imaging pixel defined in claim 5, wherein silicon layer has an additional opening that overlaps the opening in the color filter layer.

8. The imaging pixel defined in claim 5, wherein the opening in the color filter layer is filled with plurality of color filters with different colors.

9. The imaging pixel defined in claim 5, wherein the opening in the color filter layer is filled with a color filter element and the dielectric layer.

10. The imaging pixel defined in claim 5, wherein the lower substrate layer comprises an additional silicon layer and an additional dielectric layer, wherein the second photodiode is formed in the additional silicon layer, and wherein additional metal interconnect routing paths are formed in the additional dielectric layer.

11. The imaging pixel defined in claim 10, further comprising:
    an interconnect layer that couples the metal interconnect routing paths to the additional interconnect routing paths.

12. The imaging pixel defined in claim 1, further comprising:
    a microlens formed over the opening in the color filter layer, wherein the microlens overlaps the second photodiode.

13. The imaging pixel defined in claim 12, further comprising:
    an additional microlens formed over the first photodiode.

14. An imaging pixel comprising:
    a first wafer with a first photosensitive layer, wherein the first photosensitive layer is a ring-shaped photosensitive layer with an opening;
    a second wafer with a second photosensitive layer, wherein the second photosensitive layer is formed beneath the opening in the ring-shaped photosensitive layer; and
    a color filter layer that overlaps the first photosensitive layer, wherein the color filter layer comprises a window that overlaps the opening of the ring-shaped photosensitive layer and the second photosensitive layer.

15. The imaging pixel defined in claim 14, wherein the window comprises a dielectric material.

16. The imaging pixel defined in claim 14, wherein the color filter layer has a first color, wherein the window comprises a color filter element that has a second color, and wherein the first and second colors are different.

17. The imaging pixel defined in claim 14, wherein the first and second wafers are coupled together by a metal interconnect layer.

18. The imaging pixel defined in claim 14, further comprising:
    a first microlens formed over the first photosensitive layer;
    a second microlens formed over the second photosensitive layer, wherein the second microlens is completely surrounded by the first microlens; and
    a third microlens formed over the first and second photosensitive layers.

19. An image sensor comprising:
    a substrate layer that comprises a silicon layer and a dielectric layer;

a first plurality of photodiodes positioned in a first plane, wherein the first plurality of photodiodes are formed in the silicon layer of the substrate layer;

metal interconnect routing paths formed in the dielectric layer;

a color filter array with a plurality of color filter elements, wherein the color filter array has first and second opposing surfaces and wherein each color filter element of the plurality of color filter elements overlaps a respective photodiode of the first plurality of photodiodes; and a second photodiode positioned in a second plane that is different from the first plane, wherein the color filter array comprises an opening that extends from the first surface to the second surface, wherein the opening overlaps the second photodiode to allow light to reach the second photodiode, and wherein the opening in the color filter array is filled with dielectric material of the dielectric layer.

20. The image sensor defined in claim 19, wherein the first plurality of photodiodes are positioned a first distance from the color filter array, wherein the second photodiode is positioned a second distance from the color filter array, and wherein the second distance is greater than the first distance.

21. The image sensor defined in claim 19, wherein the opening is formed in a single color filter element of the plurality of color filter elements.

22. The image sensor defined in claim 19, wherein the opening is formed between at least two color filter elements of the plurality of color filter elements.

* * * * *